(12) United States Patent
Kim

(10) Patent No.: US 8,486,784 B2
(45) Date of Patent: Jul. 16, 2013

(54) VERTICAL SEMICONDUCTOR DEVICE AND METHOD OF MANUFACTURING THE SAME

(75) Inventor: Hyun Jung Kim, Icheon (KR)

(73) Assignee: Hynix Semiconductor Inc., Icheon (KR)

(*) Notice: Subject to any disclaimer, the term of this patent is extended or adjusted under 35 U.S.C. 154(b) by 7 days.

(21) Appl. No.: 12/979,323

(22) Filed: Dec. 27, 2010

(65) Prior Publication Data
US 2011/0180910 A1  Jul. 28, 2011

(30) Foreign Application Priority Data

Jan. 27, 2010  (KR) .................. 10-2010-0007420

(51) Int. Cl.
*H01L 21/336* (2006.01)

(52) U.S. Cl.
USPC ........... 438/268; 257/302; 257/329; 257/330; 257/E21.41; 257/E21.418; 257/E21.419; 257/E21.629; 257/E29.257; 257/E29.262; 438/156; 438/173; 438/206; 438/244; 438/270; 438/530

(58) Field of Classification Search
USPC ........... 257/302, 329, 330, E21.41, E21.418, 257/E21.419, E21.629, E29.257, E29.26, 257/E29.262; 438/156, 173, 206, 244, 254, 438/268, 270, 530
See application file for complete search history.

(56) References Cited

U.S. PATENT DOCUMENTS

| | | | |
|---|---|---|---|
| 5,519,236 A * | 5/1996 | Ozaki | .................. 257/302 |
| 6,355,529 B2 * | 3/2002 | Heo et al. | .................. 438/270 |
| 6,808,979 B1 | 10/2004 | Lin et al. | |
| 6,936,512 B2 | 8/2005 | Chudzik et al. | |
| 2002/0066925 A1 | 6/2002 | Gruening et al. | |
| 2004/0029346 A1 | 2/2004 | Jaiprakash et al. | |

* cited by examiner

*Primary Examiner* — Meiya Li

(57) ABSTRACT

A vertical semiconductor device with improved junction profile and a method of manufacturing the same are provided. The vertical semiconductor device includes a pillar vertically extended from a surface of a semiconductor substrate, a silicon layer formed in a bit line contact region of one sidewall of the pillar, and a junction region formed within a portion of the pillar contacting with the silicon layer.

19 Claims, 9 Drawing Sheets

VERTICAL SEMICONDUCTOR DEVICE AND METHOD OF MANUFACTURING THE SAME

CROSS-REFERENCES TO RELATED APPLICATION

The priority of Korean patent application No. 10-2010-0007420 filed on Jan. 27, 2010, the disclosure of which is hereby incorporated in its entirety by reference, is claimed.

BACKGROUND OF THE INVENTION

1. Technical Field

The inventive concept relates to a vertical semiconductor device and a method of manufacturing the same, and more particularly, to a vertical semiconductor device with improved junction profile of a buried bit line junction region and a method of manufacturing the same.

2. Related Art

As integration of semiconductor devices increases, channel lengths is of transistors become shorter. The reduction of the channel length leads to a short channel effect such as drain induced barrier lowering (DIBL), a hot carrier effect, and punch through. Methods to solve this problem include a method for reducing a depth of a junction region or a method of relatively increasing a channel length by forming a recess in a channel region of a transistor.

However, as integration of semiconductor memory devices, especially dynamic random access memories (DRAMs), approach Giga bytes, methods to fabricate transistors having smaller size have been required. That is, transistors of Giga byte-graded DRAMs require device dimensions of below 8F2 (F: minimum feature size) and further require device dimensions of about 4F2. Accordingly, although the channel length is scaled down, it is difficult to satisfy the required device dimension in a plan transistor structure in which a stack gate is disposed on a semiconductor substrate and junction regions are disposed at both sides of the stack gate.

Vertical semiconductor devices have been suggested to solve this problem. The conventional vertical semiconductor devices are fabricated by making a bit line region to be open, filling a doped polysilicon layer within a trench between pillars, and forming a buried junction region by performing a heat treatment. However, when the doped polysilicon layer is directly deposited on the bit line contact region, dopants within the polysilicon layer are excessively diffused and have trouble forming a buried type shallow bit line junction region.

Conventional methods to prevent this problem include depositing a Ti/TiN layer on the bit line contact region of the pillar and then depositing is the doped polysilicon layer. However, a SiN layer that is not TiSiX is formed at a portion in which a Ti layer is thinly formed by poor step coverage of a Ti/TiN layer formed in the bit line contact region. The SiN layer serves as a diffusion barrier layer so that a junction profile of the bit line junction region becomes non-uniform.

Especially in the case of a Plasma Enhanced Chemical Vapor Etch (PECVE) Ti layer, side step coverage is poorer than bottom step coverage. If the Ti/TiN layer is deposited and then an etch back process is performed, the side portion of the Ti/TiN layer is reduced more than the bottom portion, resulting in a weak barrier function. The Ti layer may be thickly deposited to prevent a diffusion barrier of the dopants by forming the SiN layer. However, it is preferable that the Ti layer is thinly formed with a minimum of $TiSi_2$ in order to easily remove the doped polysilicon layer, after the bit line junction region is formed.

SUMMARY

The inventive concept is to provide a vertical semiconductor device with an improved junction profile of a bit line junction region and a method of manufacturing the same.

According to one aspect of an exemplary embodiment, a semiconductor device includes a pillar vertically extended from a surface of semiconductor substrate, a silicon layer formed in a contact region of one sidewall of the pillar, and a junction region formed within a portion of the pillar contacting with the silicon layer.

The silicon layer may include a selective epitaxial-growth layer.

The vertical semiconductor device according to the inventive is concept further includes a diffusion control layer formed on the silicon layer. The diffusion control layer may include a Ti/TiN layer.

According to another aspect of another exemplary embodiment, a method of manufacturing a vertical semiconductor device includes forming pillars vertically extended from a surface of a semiconductor substrate, forming a first conduction layer to be buried within a trench between the pillars, thereby exposing upper portions of both sidewalls of each of the pillars, forming a linear insulating layer on exposed upper portions of the pillars to expose portions of the both sidewalls of each of the pillars between the linear insulating layer and the first conduction layer, forming a linear conduction layer of a spacer type on one sidewall of each of the pillars including the first conduction layer and to expose one of exposed portions of each of the pillars which is disposed in the other sidewall of each of the pillars to define a contact region, forming a semiconductor layer in the contact region between the first conduction layer and the linear insulating layer of the other sidewall of each of the pillars, forming a second conduction layer on the first conduction layer within the trench, and forming a junction region within a portion of each of the pillars contacting with the semiconductor layer.

A forming a mask pattern includes forming a mask layer on an to entire surface of the semiconductor substrate, ion-implanting dopants into the mask payer except for a portion of the mask layer corresponding to the other sidewall of each of the pillars by a tilt ion implantation process, and removing the portion of the mask layer in which the dopants are not ion-implanted.

The mask layer may include an undoped polysilicon layer and the dopants may include boron.

The method of manufacturing a vertical semiconductor device may further include surface-treating the exposed portions of the pillars between the forming a linear insulating layer and forming a semiconductor layer. The surface-treating may include a dry cleaning process or a wet cleaning process.

The method of manufacturing a vertical semiconductor device may further include forming a diffusion control layer on the both sidewalls of each of the pillars between the forming semiconductor layer and the forming a second conduction layer.

Furthermore, the forming a semiconductor layer in the contact region may include forming a selective eptitaxial-growth silicon layer.

These and other features, aspects, and embodiments are described below in the section entitled "DESCRIPTION OF EXEMPLARY EMBODIMENT".

BRIEF DESCRIPTION OF THE DRAWINGS

The above and other aspects, features, and other advantages of the subject matter of the present disclosure will be more clearly understood from the following detailed description taken in conjunction with the accompanying drawings, in which.

DESCRIPTION OF EXEMPLARY EMBODIMENT

Figure 1A:
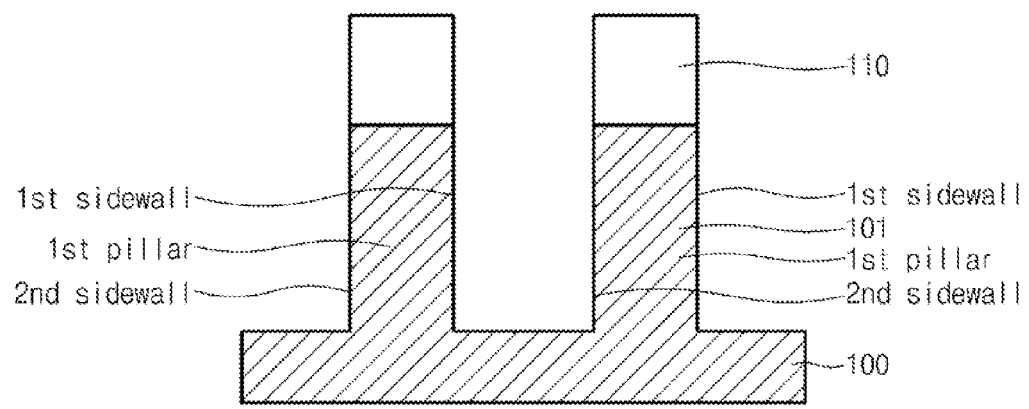
FIGS. 1 to 16 are cross-sectional views illustrating a method of manufacturing a vertical semiconductor device according to an exemplary embodiment of the inventive concept.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIGS. 1 to 16 are cross-sectional views illustrating a method of manufacturing a vertical semiconductor device according to an exemplary embodiment of the inventive concept.

Figure 1B:
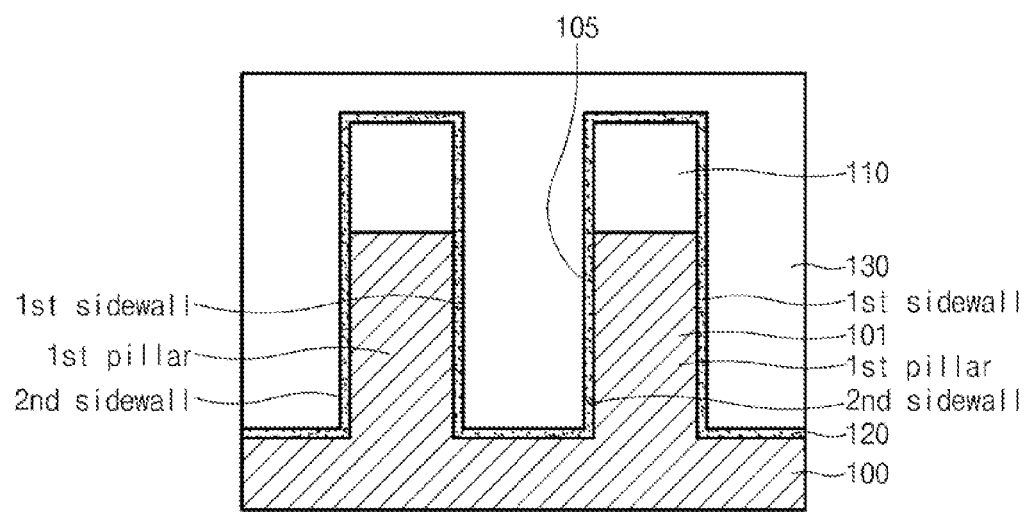

Referring to FIG. 1, a hard mask layer 110 is formed on a semiconductor substrate 100. The hard mask layer may include a hard mask material layer and an antireflection layer. At this time, the hard mask material layer may include a stack layer of a nitride layer and an amorphous carbon layer (ACL). The antireflection layer may include a silicon oxynitride (SiON) layer. A pad oxide layer (not shown) may be further formed below the hard mask layer 110.

The hard mask layer 110 is patterned by using a bit line mask (not shown) to expose a portion of the semiconductor substrate 100 in which a trench is to be formed. The exposed portion of the semiconductor substrate 100 is etched by a constant depth by using the hard mask layer 110 as an etch mask to form pillars 101 which are active regions and the trench 105 for a buried bit line between the pillars 101. At this time, the semiconductor substrate 100 may be etched so that the trench 105 has a depth of 2000 to 3000 Å.

A first linear insulating layer 120 is deposited on the semiconductor substrate 100 including the pillars 101. The first linear insulating layer 120 may include a Low Pressure Tetra Ethyl Ortho Silicate (LPTEOS) layer. The first linear insulating layer 120 may be formed to have a thickness of 50 to 150 Å. A first conduction layer 130 is formed on the first linear insulating layer 120 sufficient to fill the trench 105. The first conduction layer 130 may include a polysilion layer.

Figure 2:
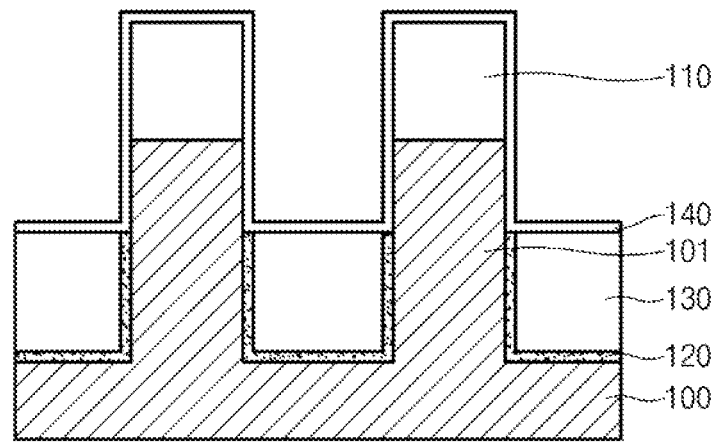

Referring to FIG. 2, the first conduction layer 130 is etched back by a constant thickness to expose upper portions of the pillars 101. At this time, the first conduction layer 130 may be etched back to remain at a thickness of about 700 to 1000 Å within the trench 105. The etching amount of the first conduction layer 130 may be determined depending on the size of a bit line contact region which is to be formed in the following process. When the first conduction layer 130 is etched back, the first linear insulating layer 120 may be etched back. Subsequently, a second linear insulating layer 140 is formed on the entire exposed surface of the semiconductor. The second to linear insulating layer 140 may include a nitride layer, and may be formed to a thickness of 50 to 100 Å.

Figure 3:
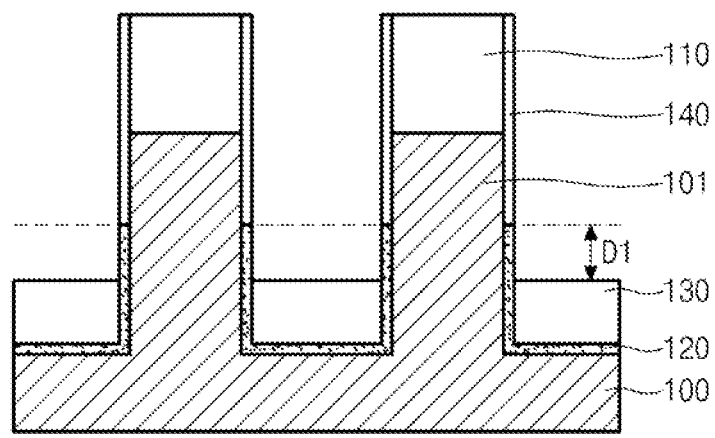

Referring to FIG. 3, the second linear insulating layer 140 is etched back to remain as a spacer at both sidewalls of each of the pillars 101, and to expose an upper surface of the hard mask layer 110 and an upper surface of the first conduction layer 130. Subsequently, the exposed first conduction layer 130 is further etched by a constant thickness D1. At this time, an etching amount of the first conduction layer is determined according to the desired size of the bit line contact region. For example, the first conduction layer may be further etched by a thickness of 200 to 400 Å.

Figure 4:
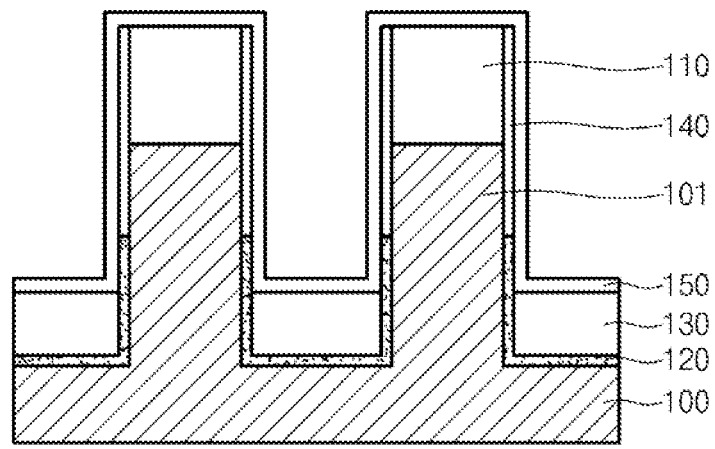

Referring to FIG. 4, a first linear conduction layer 150 is formed on the entire exposed surface of the semiconductor. The first linear conduction layer 150 may include a TiN layer, and may be deposited to a thickness of 80 to 120 Å.

Figure 5:
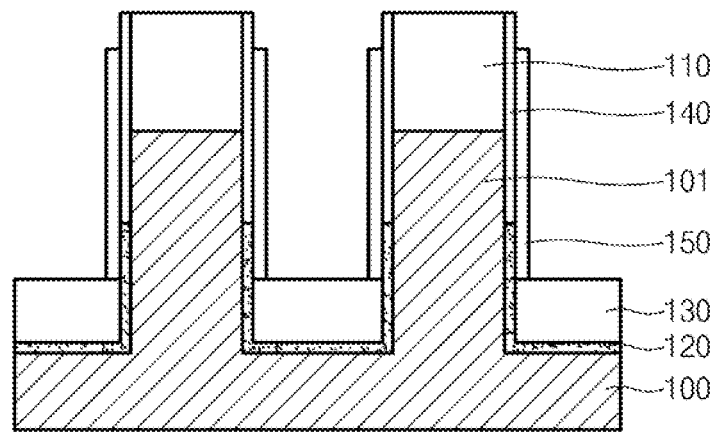

Referring to FIG. 5, the first linear conduction layer 150 is etched back to remain as a spacer type on the both sidewalls of each of the pillars 101. At this time, the first linear conduction layer 150 may be over-etched to form a step against second linear insulating layer 140 at an upper portion of the pillars 101.

Figure 6:
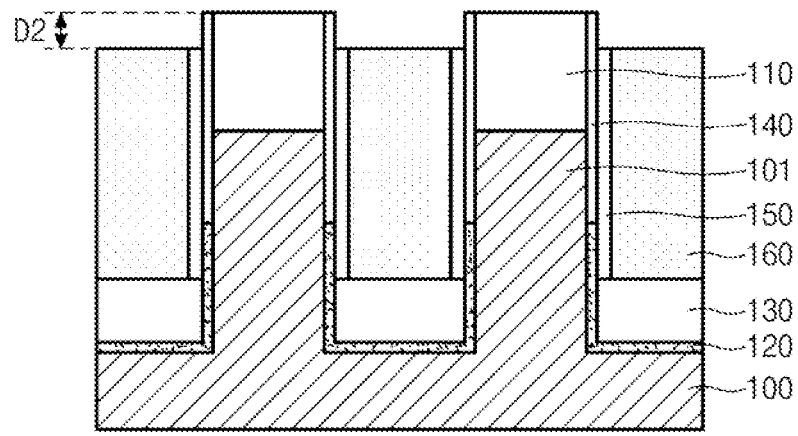

Referring to FIG. 6, an insulating layer 160 is formed within the trench 105. The insulating layer 160 may include an oxide layer. The insulating layer 160 is then etched back or chemical mechanical polished to be recessed by a constant thickness D2, for example by 600 Å, from the upper surface of the hard mask layer 110. If the first linear conduction layer 150 was not previously over-etched in the step illustrated by FIG. 5, it may be etched by a constant thickness D2 from the upper surface of the hard mask layer 110 when the insulating layer 160 is etched.

Figure 7:
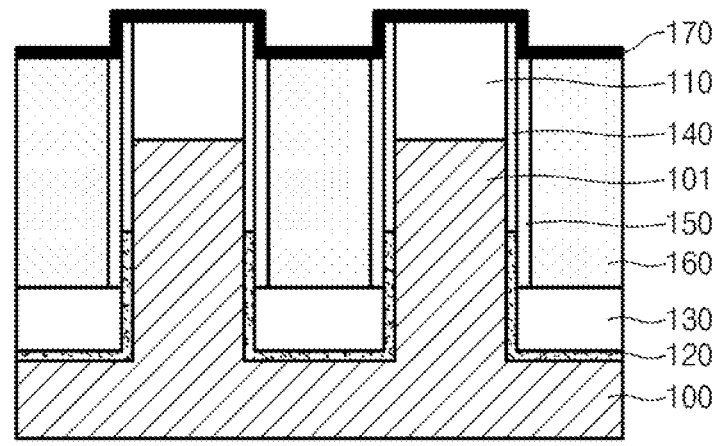

Referring to FIG. 7, a second linear conduction layer 170 is formed on the entire exposed surface of the semiconductor. The second linear conduction layer 170 may include a polysilicon layer, and may be formed at a thickness of 50 to 150 Å.

Figure 8:
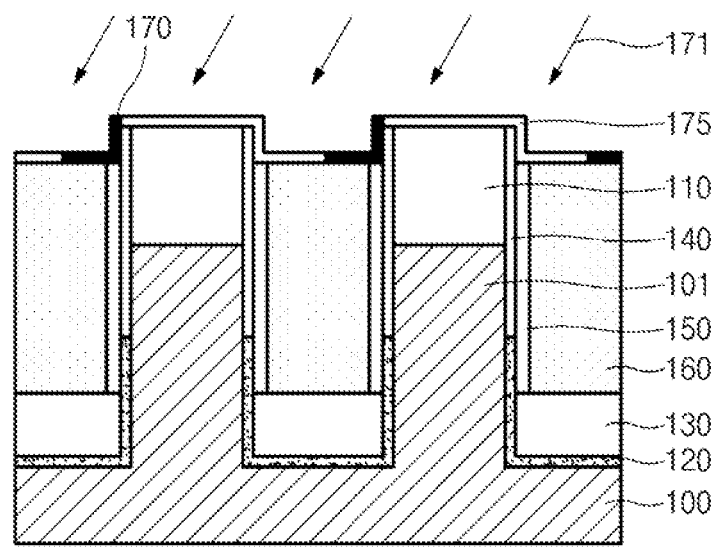

Referring to FIG. 8, a tilt ion implantation process 171 is performed to obliquely ion-implant dopants into the second linear conduction layer 170. The dopants are ion-implanted into only a portion 175 of the second linear conduction layer 170 corresponding to one sidewall of each of the pillars 101. That is, the dopants are ion-implanted into only the portion 175 of the second linear conduction layer 170 and not the portion of the second linear conduction layer 170 corresponding to the other sidewall in which the bit line contact region is to be formed in the following process. The dopants may include boron.

Figure 9:
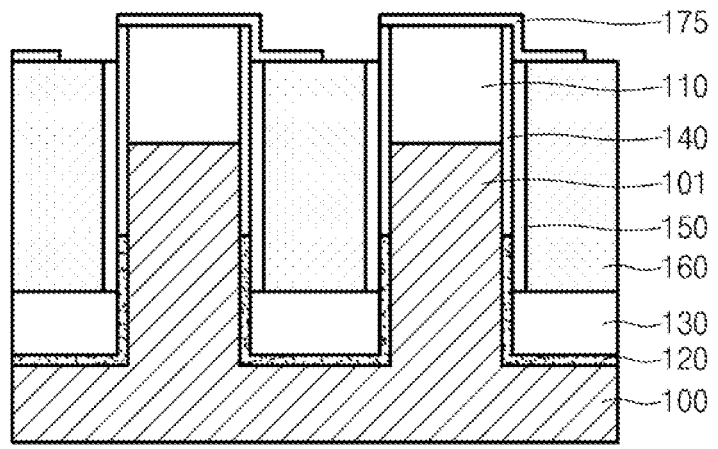

Referring to FIG. 9, the un-doped portion of the second linear conduction layer 170 is removed by using selective etching, leaving the doped portion 175, and exposing a portion of the first linear conduction layer 150 disposed on the sidewall of each of the pillars 101.

Figure 10:
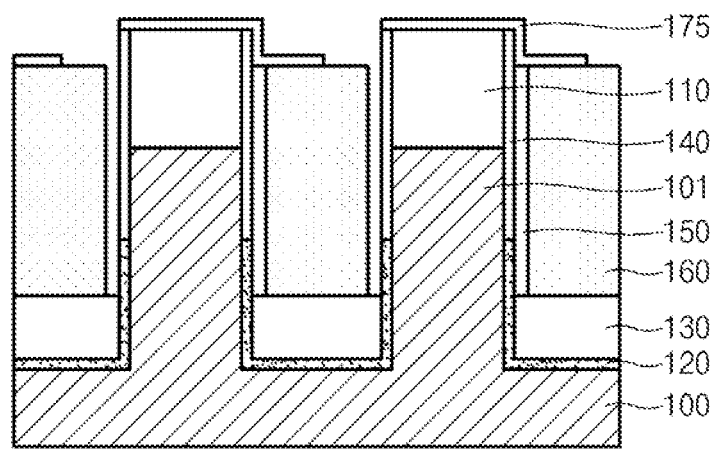

Referring to FIG. 10, the exposed side of the first linear conduction layer 150 is removed using the remaining second linear conduction layer 175 as an etch mask.

Figure 11:
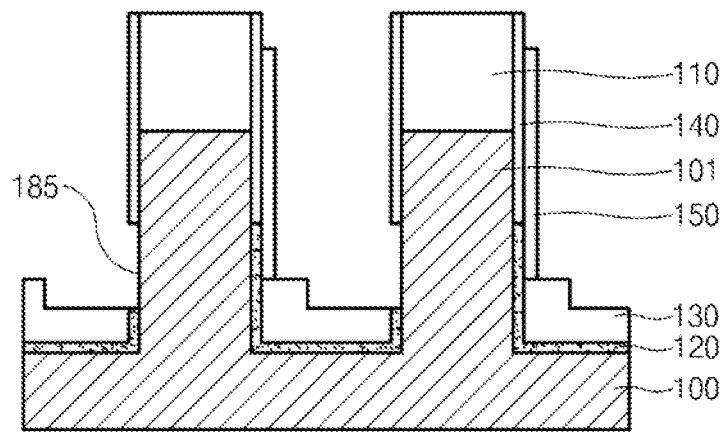

Referring to FIG. 11, the remaining second linear conduction layer 175 is removed to expose the upper surface of the hard mask layer 110. Subsequently, the insulating layer 160 is removed to expose the upper to surface of the first conduction layer 130. Due to the partial presence of the remaining second linear conduction layer 175 over the insulating layer 160, when an etching process, especially a dry etching process, onto the remaining second linear conduction layer 175 and the insulating layer 160 is completed, the first conduction layer 130 may turn out to have a stepped configuration. The first conduction layer 130 may be further etched to expose a portion of the first linear insulating layer 120 disposed on the other sidewall of each pillar 101. Then, the exposed portion of the first linear insulating layer 120 is removed. At this time, a portion of the other sidewall of each of the pillars 101 and a portion of the second linear insulating layer 140 disposed on the other sidewall of each of the pillars 101 are exposed. Also, the second linear conduction layer 150 remaining on the one sidewall of each of the pillars 101 is exposed. Accordingly, the bit line contact region 185 is defined to expose the portion of the other sidewall of each of the pillars 101. The bit line contact region 185 is only formed on one side of each of the pillars 101 so that it is referred to as a one-side contact (OSC).

Figure 12:
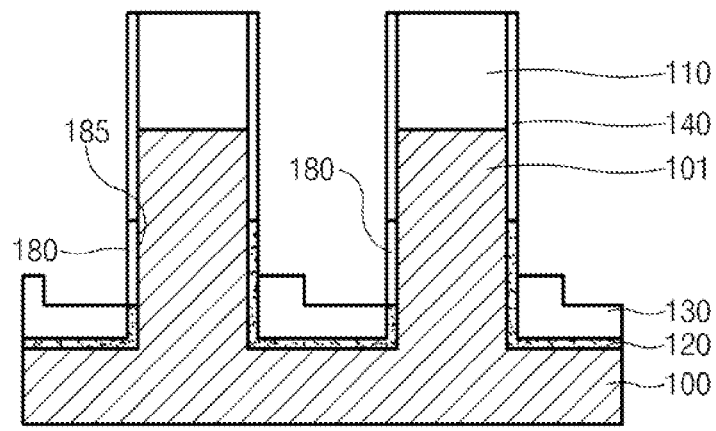

Referring to FIG. 12, the remaining portions of the first linear conduction layer 150 are removed. Then, the portions of the pillars 101 exposed through the bit line contact regions 185 are surface-treated. At this time, the surface-treatment may be performed by a wet cleaning process or a dry cleaning process. Subsequently, a semiconductor layer 180 is formed in the surface-treated bit line contact region 185. The semiconductor layer 180 may include a silicon layer. The semiconductor layer 180 may be formed by a selective epitaxial growth (SEG) process. A conductive layer can replace the semiconductor layer 180.

Figure 13:
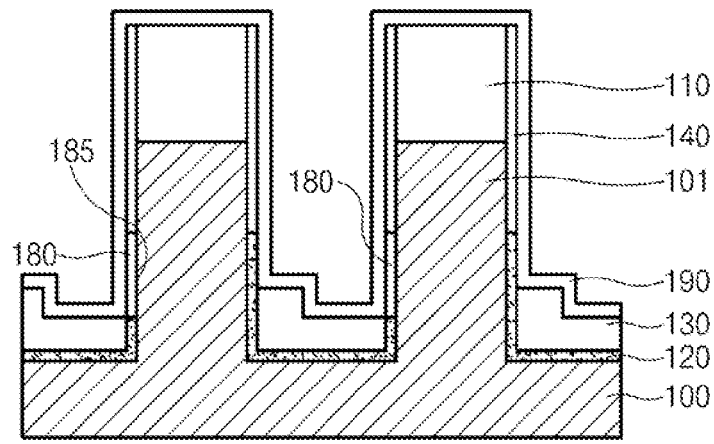
Figure 14:
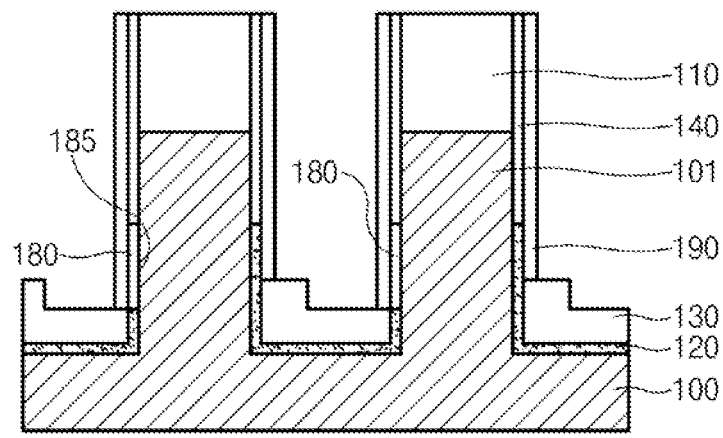

Referring to FIGS. 13 and 14, a diffusion barrier layer (or diffusion control layer) 190 is formed on an entire surface of the semiconductor. The diffusion control layer 190 may include Ti/TiN. As the diffusion control layer 190, a Ti layer and a TiN layer may be formed at a thickness of 30 to 70 Å and 40 to 60 Å, respectively. Subsequently, the diffusion control layer 190 is is etched back to remain as a spacer at the both sidewalls of each of the pillars 101.

Figure 15:
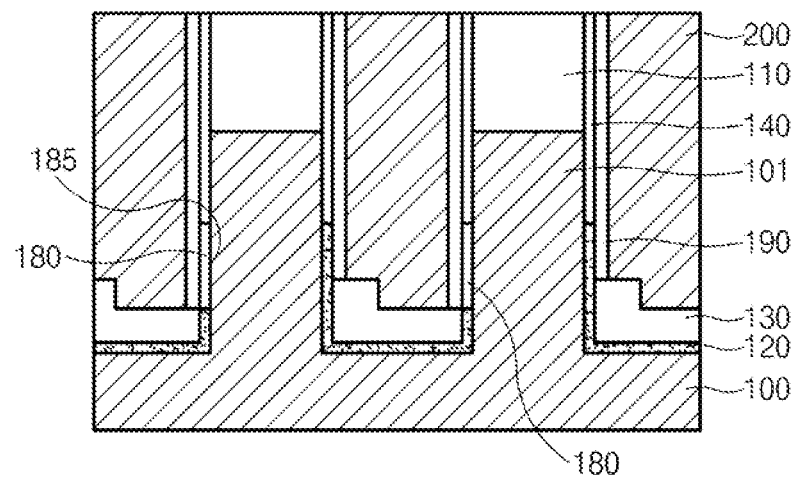
Figure 16:
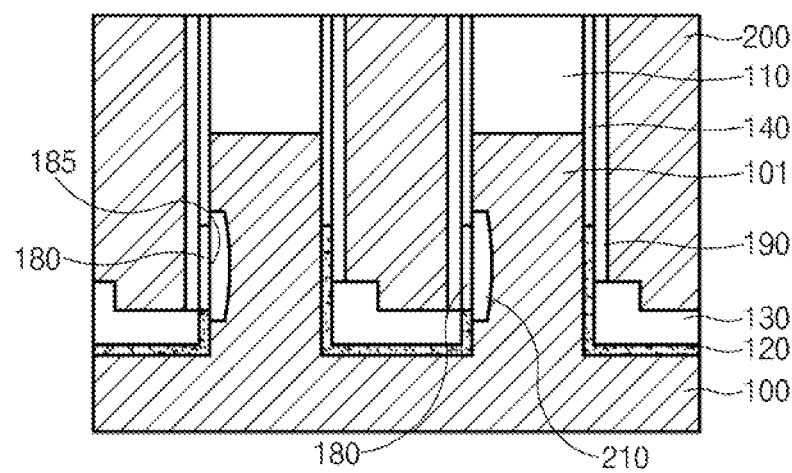

Referring to FIGS. 15 and 16, a second conduction layer 200 is formed on an entire surface of the semiconductor to completely fill the trench 105. The second conduction layer 200 may include doped polysilicon. For example, the second conduction layer 200 may include P-doped polysilicon. The second conduction layer 200 may be formed at a thickness of 400 to 800 Å. The second conduction layer 200 is etched back or chemical mechanical polished to be planarized until the upper surface of the hard mask layer 100 is exposed. Subsequently, phosphorouses doped within the second conduction layer 200 are diffused into the pillars 101 by a heat treatment to form a bit line junction region 210 in the pillar 101 under the semiconductor layer 180. The shallow bit line junction region 210 may have a desired dopant profile by being formed through the diffusion control layer 190 serving as a diffusion "barrier" of dopants, e.g., controlling the diffusion of the dopants.

A bit line is formed between neighboring pillar patterns 105 so as to be electrically coupled to the bit line junction region 210 through the diffusion barrier layer 190 and the semiconductor layer 180.

The above embodiment of the present invention is illustrative and to not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a vertical semiconductor device, comprising:
    forming a first pillar and a second pillar over a semiconductor substrate, the first pillar and the second pillar each comprising a first sidewall and a second sidewall, the first sidewall of the first pillar facing the second sidewall of the second pillar;
    forming a first conduction layer between the first pillar and the second pillar, the first conduction layer having a height lower than heights of the first and second pillars;
    forming a linear insulating layer over portions of the first and second sidewalls of each of the first pillar and the second pillar, wherein the portions are not covered by the first conduction layer;
    etching the first conduction layer by a constant thickness;
    forming a linear conduction layer over the first sidewall of the first pillar to expose a contact region in the second sidewall of the second pillar;
    forming a semiconductor layer over the contact region;
    forming a second conduction layer over the first conduction layer; and
    forming a junction region within the second pillar.

2. The method of claim 1, wherein forming the first pillar and the second pillar further includes:
    forming a first mask defining the first pillar and the second pillar over the semiconductor substrate;
    etching the semiconductor substrate using the first mask as an etching mask; and
    forming a linear oxide layer on the semiconductor substrate including the first pillar and the second pillar.

3. The method of claim 1, wherein forming the linear conduction layer further includes:
    forming a third conduction layer over the first and second sidewalls of each of the first pillar and the second pillar;
    forming an insulating layer over the first conduction layer to expose a top surface of the third conduction layer formed over the second sidewall of the second pillar;
    forming a second mask exposing the third conduction layer formed over the second sidewall of the second pillar; and
    removing the third conduction layer formed over the second sidewall of the second pillar using the second mask as an etch mask.

4. The method of claim 3, wherein the third conduction layer includes titanium nitride (TiN).

5. The method of claim 3, wherein forming the second mask further includes:
    forming a mask layer including a first mask layer portion and a second mask layer portion, the first mask layer portion being formed over an upper surface of the first pillar, the first sidewall of the first pillar and a first portion of the insulating layer, and the second mask layer portion is formed over the second sidewall of the second pillar and a second portion of the insulating layer;
    ion implanting dopants into the first mask layer portion such that the second mask layer portion is not implanted with the dopants; and
    removing the second mask layer portion.

6. The method of claim 5, wherein the mask layer includes an undoped polysilicon.

7. The method of claim 5, wherein the dopants include boron.

8. The method of claim 3, further comprising removing the second mask and the insulating layer to expose the first conduction layer.

9. The method of claim 8, further comprising further etching the exposed first conduction layer to expose the contact region.

10. The method of claim 1, wherein forming the linear insulating layer further includes:
    forming a nitride layer over the first pillar, the second pillar, and the first conduction layer; and
    etching back the nitride layer such that the nitride layer remains over the first and second sidewalls of each of the first and second pillars.

11. The method of claim 1, further comprising surface-treating the contact region before forming the semiconductor layer.

12. The method of claim 11, wherein the surface-treating is performed by a dry cleaning process or a wet cleaning process.

13. The method of claim 1, further comprising forming a diffusion control layer over the first and second sidewalls of each of the first and second pillars after forming the semiconductor layer and before forming the second conduction layer.

14. The method of claim 13, wherein the diffusion control layer includes Ti and TiN.

15. The method of claim 1, wherein the second conduction layer includes a polysilicon layer doped with dopants, and the dopants are diffused in a heat treatment process.

16. The method of claim 1, wherein forming the semiconductor layer over the contact region includes forming a silicon layer by a selective epitaxial growth process.

17. A method of manufacturing a vertical semiconductor device, the method comprising:
    forming a pillar over a substrate;
    forming a semiconductor pattern over a sidewall of the pillar;
    forming a diffusion control layer over the semiconductor pattern;
    forming a source layer having dopants over the diffusion control layer; and
    performing a diffusion process to diffuse the dopants from the source layer into the sidewall of the pillar through the semiconductor pattern and the diffusion control layer, the diffusion process forming a bit line junction in the sidewall of the pillar.

18. The method of claim 17, wherein the semiconductor pattern and the source layer are formed in separate processes.

19. The method of claim 17, wherein the semiconductor pattern and the source layer include different materials.

* * * * *